(12) United States Patent
Gehlot (10) Patent No.: US 6,353,806 B1
(45) Date of Patent: Mar. 5, 2002

(54) SYSTEM LEVEL HARDWARE SIMULATOR AND ITS AUTOMATION

(75) Inventor: Narayan L. Gehlot, Sayerville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/197,802

(22) Filed: Nov. 23, 1998

(51) Int. Cl.⁷ .......................... G06F 9/44; G06F 13/10; G06F 13/12
(52) U.S. Cl. ............................... 703/21; 703/23; 716/1
(58) Field of Search .............................. 703/1–2, 13–14, 703/17–21, 23–28; 716/1, 19

(56) References Cited

U.S. PATENT DOCUMENTS 5,623,418 A * 4/1997 Rostoker et al. ................ 716/1
5,910,897 A * 6/1999 Dangelo et al. ............... 716/19

OTHER PUBLICATIONS

Walrath et al, "Symbolic Evaluation of Performance Models for Tradeoff Visualization", Proceedings of the 34th Design Automation Conference, pp. 359–364 (Jun. 1997).*

Cochran et al, "Using Symbolic Modeling in Business Re–engineering", IEEE Proceedings of the 1993 Winter Simulation Conference, pp. 1177–1184 (Dec. 1993).*

Rharmaoui et al, "Integration of Know–How in CAD/CAM Systems: A Way to Improve the Design Process", IEEE International Conference on Industrial Electronics, Control, and Instrumentaion, vol. 1 pp. 547–552 (Nov. 1993).*

* cited by examiner

*Primary Examiner*—Kevin J. Teska
*Assistant Examiner*—Samuel Broda (57) ABSTRACT

An apparatus provides for automatically generating symbolic models and developing a system level hardware simulator. The system to be simulated is subdivided into a plurality of system layers which are associated with symbolic model symbols. The specification of a symbolic model symbol represents a functionality of a system layer, a subset of the system hierarchy. Each symbolic model symbol reads from its allocated memory, gathers input from associated symbolic model symbols, updates its register contents and broadcasts updates to associated symbolic model symbols, as per its specification, completing a cycle of simulation when a complete chain of associated symbolic model symbols is updated. A displayed symbolic model can be interacted with to modify the model by altering the interconnections of the displayed symbolic model causing corresponding modification of the connections of other interconnected symbolic model symbols and their associated input/output memories. The simulator operates as a real time event simulator through further linkage of symbolic model symbols to timing information specifying real-time propagation and time delays.

36 Claims, 7 Drawing Sheets

| Systemname | Bay# | Rack# | CircuitPack# | IC# | ICGroupLayer | Symbolic Model/Symbol | Direction |
|---|---|---|---|---|---|---|---|
| ABM | B1 | R1 | CP1 | IC1 or ICG1 | L1 | 1 Adaption<br>2 Termination<br>3 Connection<br>4 Switch<br>5 New ⎯⎯┐<br>  ┌⎯Add⎯┐<br>  global    local | Sink Source Both |

FIG. 5

| Memory Register Location | Memory Bit Bit# | Memory Bit Name/Id | Memory Type | Bit Register Size | Details Initial State | mode | sense |
|---|---|---|---|---|---|---|---|
| ##########(hex) | | | Reset<br>Status<br>Delta<br>State<br>Mask<br>Event<br>Control | 1 byte<br>2 byte<br>3 byte<br>4 byte | | heterogenous<br>writeonly1char<br>write1clear<br>clearonread<br>readwrite<br>readonly<br>invalidaddress | active high<br>active low |

Register Map Display　　800

| Location | Location Name | Memory Bit Name | Bit Value Register Contents |
|---|---|---|---|
| hex 0000000000 | adr_Register1 | Register1 | # |
| hex 0000000001 | adr_Register2 | Register2 | # |
| hex 0000000002 | adr_Register3 | Register3 | # |
| hex 0000000003 | adr_Register4 | Register4 | # |
| hex 0000000004 | adr_Register5 | Register5 | # |
| hex 0000000005 | adr_Register6 | Register6 | # |
| hex 0000000006 | adr_Register6+1 | | # |
| hex 0000000007 | adr_Register7 | Register7 | # |
| hex 0000000008 | adr_Register7+1 | | # |
| hex 0000000009 | adr_Register7+2 | | # |
| hex 000000000A | adr_Register8 | Register8 | # |
| hex 000000000B | adr_Register8+1 | | # |
| hex 000000000C | adr_Register8+2 | | # |
| hex 000000000D | adr_Register8+3 | | # |
| hex 000000000E | adr_Register9 | Register9 | # |
| hex 000000000F | adr_Register9+1 | | # |
| ⋮ | | | |
| hex FFFFFFFFFE | adr_Registern-1 | Registern-1 | # |
| hex FFFFFFFFFF | adr_Registern | Registern | # |

SYSTEM LEVEL HARDWARE SIMULATOR AND ITS AUTOMATION

FIELD OF THE INVENTION

The invention relates generally to hardware simulation and more specifically to the automation of hardware simulation using symbolic models.

BACKGROUND

System development for complex electronic and computer systems requires the integration of work performed by researchers, engineers and software developers. A researcher's work serves as an input for development engineers, who are responsible for implementing a practical application of the researcher's solution or improvement. Early in the system development process, integrated circuit (IC) developers translate the statement of the proposed solution and implement the required functionality on application specific integrated circuits (ASICs). Thereafter, the ASICs are integrated on printed circuit boards, also known as circuit packs, based upon the functions they perform in the overall system architecture. Systems may comprise hundreds of ASICs and dozens of circuit packs. Developers group circuit packs in racks, and racks are grouped in bays. Depending upon the functions required and upon the system complexity, the system may include multiple bays.

It is a disadvantage in system engineering that ASIC and board development usurp a large part of the development cycle, leaving very little time for the other development tasks. For instance, software development cannot commence until hardware development is almost complete, because the hardware functionality serves as an input to the software design. Similarly, test engineers cannot begin hardware or software testing, or even devise test cases, until the hardware and software is nearly finished. For this reason, testing is often left to the end of the development cycle, and is performed under great time pressure. Furthermore, developers are not the only persons impacted by the ASIC development process; persons charged with marketing a system, or with preparing system documentation cannot commence their tasks until the hardware development is nearly complete.

To aid the development process, engineers use various tools for simulating hardware behavior. For instance, at the integrated circuit (IC) level, computer-aided tools like SYNOPSIS™ and PCAD™ are used to simulate various behavior useful to the integrated circuit developer. Very High Speed Integrated Circuit Hardware Development Language (VHDL), IEEE standard 1076 (1987), and VERILOG™ are other known tools used by IC developers for simulating behavior expected from an ASIC. Similarly, on the board level, developers use tools such as ORCAD™ to simulate board layout and other behavior useful to the board developer. There are also known tools useful to the software engineer for simulating behavior of interest. Some of these tools are MATLAB™ and MATHCAD™.

Symbolic modeling is the use of symbols to represent lower level components of a system. One form of symbolic modeling is functional modeling, which uses symbols to represent functionality of system components, as described in, for example, International Telecommunications Union (ITU)/ETSI Standards ITU-T G.805 and ETSI ETS 300 417 -1-1. There is no tool, however, which simulates behavior at the bay, rack or system level. Furthermore, no automatic generator of symbolic models exists. As a result, the time to develop, integrate and test a system (hardware and software) remains a function of the time taken to develop ICs and boards to a sufficient extent that test engineers and software developers may begin their tasks. There is a need, therefore, to develop a means for automatically generating a hardware simulator which may use symbolic modeling and which will allow other critical development tasks, such as software development, training of test engineers and training of marketing engineers, to commence earlier in the development cycle. There is also the need to develop such an automated hardware simulation generator which allows for the concurrent development of symbolic models and aids in refining and correcting researcher and IC developers' documents; this in turn, could allow software, test and marketing engineers to save hundreds of man-hours by eliminating their need to question researchers and IC developers on a one-to-one basis.

SUMMARY OF THE INVENTION

The present invention is an apparatus for automatically generating symbolic models and for automatic development of an associated system level hardware simulator. The apparatus comprises an interface and a graphics display for selecting and displaying symbolic model symbols, preferably as per ITU or ETSI standards. For each displayed symbol, the user may specify the symbol's functionality. The symbol is made specific to a hardware mapping by inputting, via an editor, a memory register location, a memory bit location name, a memory bit name, a memory register type, a memory size, the reset or initial state of the register content, and a register mode. The user also selects, via the editor, a direction for each symbol (sink, source or sink and source), a layer priority for each symbol, and chooses the bit sense condition for the associated register as active high or active low. In addition to standard predefined symbolic model symbols, the apparatus includes the ability for a user to define, store and later recall for use, a symbolic model symbol and the symbol's specified functional characteristics.

To use the simulator, the system of interest is iteratively divided into its constituent bays, the bays are divided into racks, the racks are divided into circuit packs, and the circuit packs are divided into integrated circuits (ICs). After each divisional iteration, a system layer name is defined for the resulting subset of components and a symbolic model symbol is chosen for the subset. The symbolic model symbol specifications are then input via the editor. Thus, each symbolic model symbol captures the functionality of the bay, rack, circuit pack and ICs in its functional hierarchy. The system is divided, the system layer named, symbols chosen, and functionality specified, until the entire system of interest is described.

From the symbol specifications and system layer associations, the simulator constructs and graphically displays an image of a symbolic model. Within the simulator, each symbolic model symbol has a simple input/output memory allocated to it. The symbolic model symbol reads inputs from previous connections determined by the layer and layer priority of the symbolic model symbol, that is from its source symbolic model symbol, and updates its register contents as per its specification. Each symbol then broadcasts its updates to symbolic model symbols whose input depends on the current state of the symbolic model symbol output, again according to the layer and layer priority of the symbolic model symbol. The model interconnections are shown graphically on the display. The user may interact with a displayed symbolic model and can modify the model by altering the interconnections of the displayed symbolic model, which alteration will result in corresponding modification of the connections of other interconnected symbolic model symbols and their associated input/output memories. One cycle of simulation is completed when a complete chain of registers is updated from input to output in both sink and source directions. In this mode, the simulator is a state machine and the user may access a memory map for each symbol.

In another mode, the simulator may be operated as a real time simulator. Each symbolic model symbol is linked to IC simulation language files such as Very High Speed Integrated Circuit Hardware Description Language (VHDL) or VERILOG™ files used by the application specific integrated circuit developers. These files contain timing information specifying the real-time propagation through the IC's represented by the symbol. Further real-time information may be input to capture the time delays imparted by the connections between symbolic model symbols. By linking to IC simulation language timing information and inputting other delay information associated with the symbolic model, the simulator becomes a real-time event simulator.

BRIEF DESCRIPTION OF THE DRAWINGS

For a better understanding of the present invention, reference may be had to the following description of exemplary embodiments thereof, considered in conjunction with the accompanying drawings, in which.

DETAILED DESCRIPTION

A hardware simulator according to the present invention uses symbolic models to simulate systems. The invention provides a display for graphically depicting a symbolic model and an editor for inputting a functional specification for each symbolic model symbol. Each symbol specification is stored in a data base and the simulator constructs graphic representations of a symbolic model from the information. In a preferred embodiment, the hardware simulator of this invention is implemented in a computer, and the instructions are coded in any platform independent language, such as JAVA® or PERL™. Of course, other embodiments may be implemented using platform dependent languages, such as C++ or Fortran.

Simulator Architecture

Figure 1:
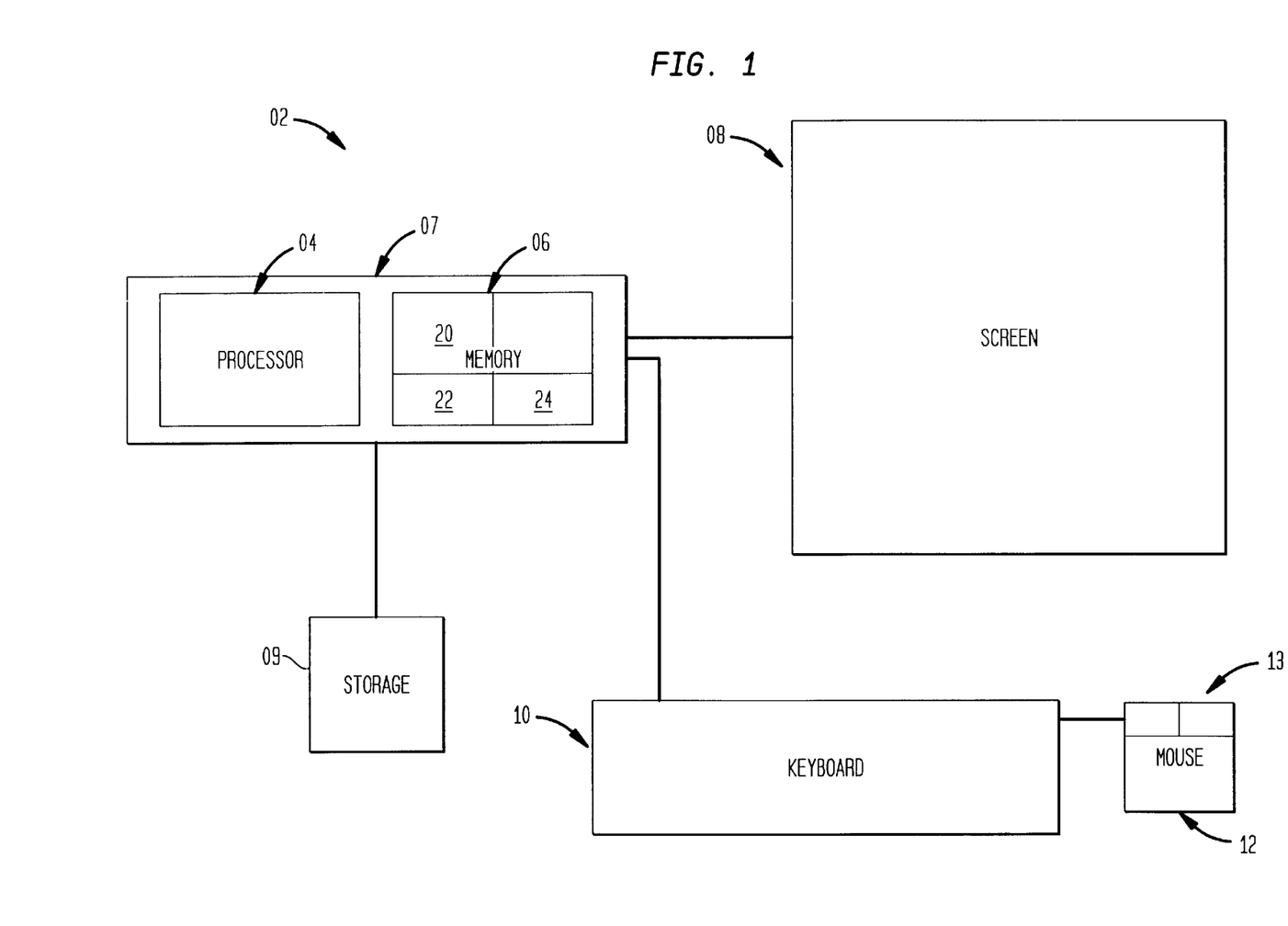
FIG. 1 illustrates an exemplary embodiment of a computer-based symbolic model hardware simulator.

FIG. 1 illustrates an exemplary embodiment of a computer-based simulator system 02 according to the invention. The system 02 comprises a processing unit 07, a display screen terminal 08, input devices, e.g., a keyboard 10, and storage devices, such as a hard disk 09. The processing unit 07 includes a processor 04 and a memory 06. The memory 06 includes areas 20, 22 and 24 for storing, among other things, instructions for processor 04. A selection device 12 includes switches 13 having a positive on and a positive off position for generating signals to the system 02. The screen 08, keyboard 10 and selection device 12 are collectively known as the user interface devices.

In the preferred embodiment, the system 02 utilizes a known computer operating system, such as UNIX®, Windows 95® or Windows 98®, and XWindows® as the windowing system for providing an interface between the user and a graphical user interface (GUI). The operating system and XWindows® can be found resident in area 20 and 22, respectively, in the memory 06. When implemented as a set of instructions for a computer processor, the method of the invention is written in the JAVA® programming language, and the instructions, including the JAVA® virtual machine, can be found resident in area 24 in the memory 06 of the system 02. As is known in the art, JAVA® is a platform independent, object oriented programming language and is fully described by Sun Micro Systems, Inc. through its internet web site. The URL is wwwjava.sun.com. The JAVA® Development Kit, descriptive documentation, and related products are also available by linking to www-java.sun.com.

Alternatively, the system may include hardware and software operable to permit communication with the World Wide Web or with a local network. In that case, the software would include a JAVA® enabled browser, such as Netscape Navigator™. This enables the system 02 to operate as a hardware simulator when running the instruction set from a web site where the platform independent language instruction set resides.

In the preferred embodiment, the simulator also provides an editor, which comprises a graphical display and a computer-human interface, such as a GUI. The graphical system causes the display 08 to show an image of the symbolic model. The interface devices 08, 10 and 12 are operable to edit the symbolic model by manipulating a computer accessible representation of the model. The graphical system implemented in the computer is responsive to inputs from the interface devices and it provides outputs indicating a state of the display 08. The editor also is responsive to manipulations of the representation and the resulting state outputs to provide inputs to the graphical system. In response to state outputs indicating a modification of the displayed symbolic model, the representation is correspondingly modified when the image is modified using the interface devices 08, 10 and 12.

Static Simulation

Figure 2:
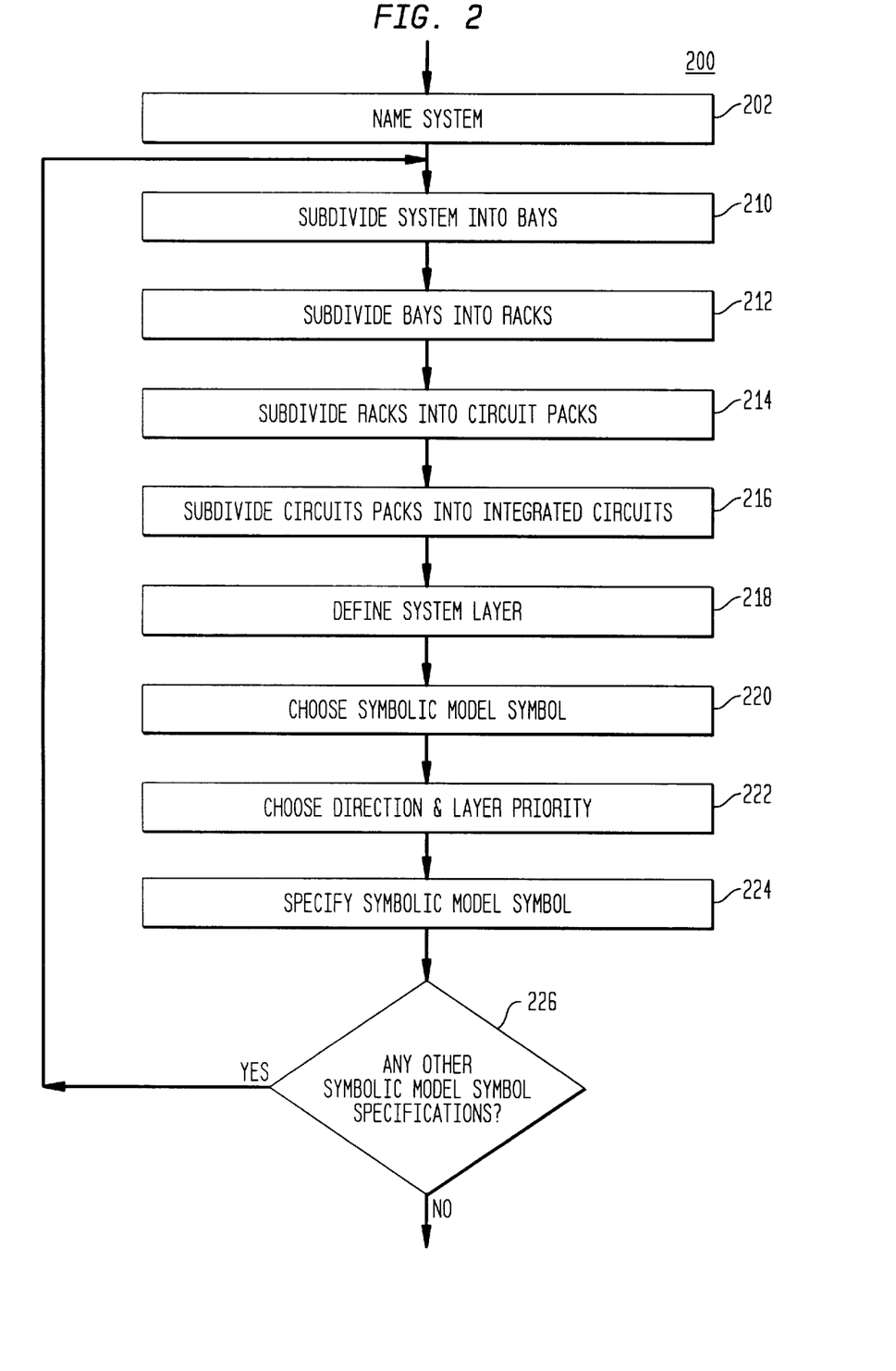
FIG. 2 is a flow chart of the an exemplary method in accordance with the invention.

The method of the invention 200 is illustrated in the flow chart of FIG. 2. In step 202, a system name is defined For any exemplary system of interest, a series of process steps divides and sub-divides the system into bays 210, the bays into racks 212, the racks into circuit packs 214, and the circuit packs into integrated circuits (ICs) 216. Each subdivides iteration yields a hierarchical list of components. After a complete iteration of steps 210–216, a system layer is defined in a process step 218 for the resulting list of components. Thus, the defined system layer will comprise a predetermined bay, rack, circuit pack and IC or IC group.

A symbolic model symbol is then chosen for the selected predetermined components in a selection step 220. For the selected symbolic model symbol, a direction is defined as sink, source or sink and source, and a layer priority is determined in a process step 222. Thereafter, the functionality of the chosen symbolic model symbol is specified in a process step 224. In a decision step 226, it is determined whether any remaining components require functional specifications, and, if so, process returns to the system division step 210. This process continues until functionality is specified for all bays, racks, circuit packs and ICs and until all system components are associated with a system layer.

Figure 3:
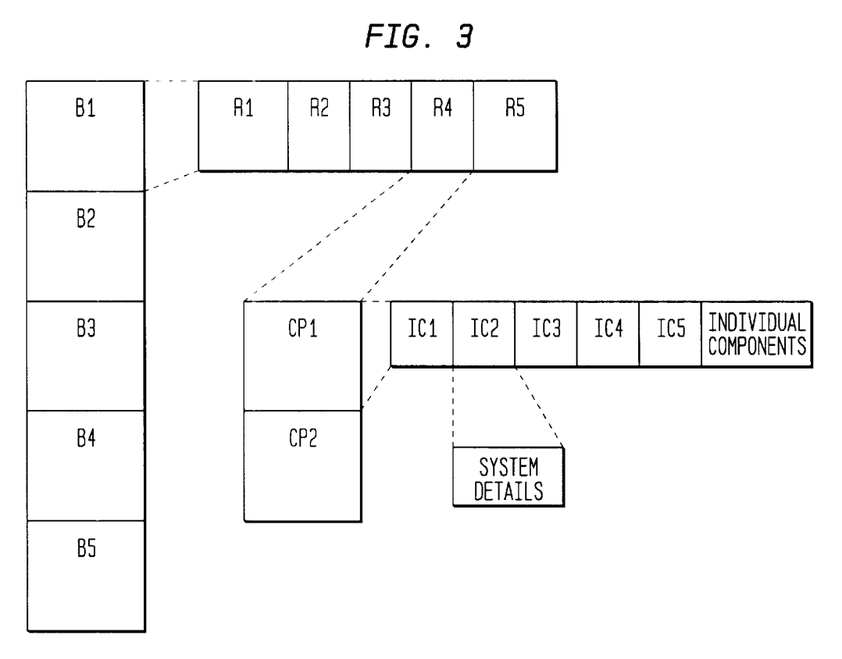
FIG. 3 is a graphic representation of an exemplary hierarchy of the specified components.

Referring now to FIG. 3, the subdivision of a system into a nesting of components is further illustrated with respect to an exemplary system 300. According to the method of the invention, the system 300 is divided into bays (B1, B2, B3, B4, B5). Each bay is further divided into racks. For example, bay B1 is divided into five racks (R1, R2, R3, R4, R5). Each rack is further divided into circuit packs. So, for instance, rack R4 comprises circuit packs CP1 and CP2. Circuit packs are then further divided to individual ICs or groups of ICs. In the example of FIG. 3, circuit pack CP1 is divided into IC1, IC2, IC3, IC4 and IC5 and other individual components. An integrated circuit is then detailed according to the desired transistors, resistors, capacitors, inductors and wires, for instance, as IC2 is in FIG. 3. According to the method of the invention, the system 300 is iteratively divided until all ICs or IC groups are associated with a bay, rack, and circuit pack, with a system layer and with symbolic model symbols defining a particular system functionality. So, for instance, B1, R4 and CP1 are associated with IC1.

Figure 4:
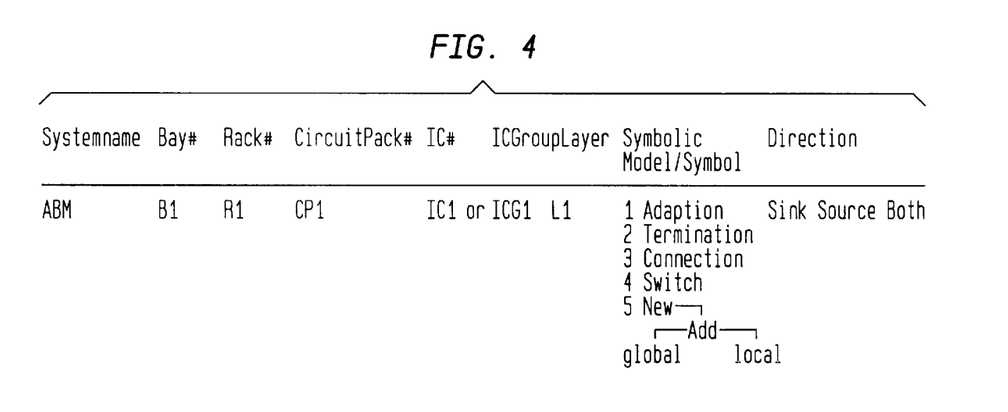
FIG. 4 is a representation of an exemplary display.

In a preferred embodiment of the invention, the hardware simulator provides a computer-human interface for performing this division task. Referring now to FIG. 4, a set of data and menu choices as would be visible on the display is shown. According to the method of the invention, a user manipulating interface devices inputs a system name, bay number, rack number, circuit pack number, and IC number or IC group number, which will be shown on the display. In the exemplary display shown in FIG. 4, the interface is used to specify one exemplary division iteration for a system named Anymedia Bandwidth Management (ABM). The system ABM has been divided into at least one bay, B1. B1 further comprises rack R1, which itself includes circuit pack CP1. The circuit pack CP1 in turn includes at least IC1 or ICG1.

After one iteration of division, the resulting components are associated with a system layer according to the process step 218 of FIG. 2. The system layer, such as a physical layer, data layer, etc., is chosen according to the user's analysis of the system of interest and the functionality of the associated ICs or IC group. The system layer association is used by the simulator to construct the resulting symbolic model. System layering is described in ATM Networks Concepts, Protocols, Applications (Addison-Wesley Publishing Co. 1994), pp 55–65. Referring again to FIG. 4, the system layer for the displayed iteration results has been defined as L1 and the simulator associates layer L1 of system ABM with B1, R1, CP1 and IC1 or ICG1.

Upon choosing a system layer, a symbolic model symbol is selected for the component group in the selection step 220 of FIG. 2. The symbolic model symbol may be a functional model symbol, which are fully described in International Telecommunications Union (ITU)/ETSI Standards ITU-T G.805, Generic Functional Architecture Of Transport Networks, and ETSI ETS 300 417-1-1, Generic Processes And Performance. The symbolic model symbols available to represent the functionality of a particular component group and associated layer are shown on the interface display by means of a pop-down menu under the heading of Symbolic Model/Symbol, as shown in FIG. 4. The illustrated choices are symbols according to the ITU standard functional model symbols: adaptation, termination, connection and fabric switch. As further shown in the exemplary display of FIG. 4, the simulator also permits a user to define a new symbolic model symbol, if so desired. After a symbolic model symbol is added to the symbolic model symbol database, it will be displayed in the list of available symbols on subsequent iterations through the selection step 220.

For each selected symbolic model symbol, a direction is chosen. The direction may be the sink direction—in which the symbolic model symbol will receive input from one or more other symbolic model symbols, the source direction— in which the symbolic model symbol provides an output to another symbolic model symbol, or both. Where a direction for a symbolic model symbol is defined as "both", the symbol acts as a sink and a source. In a computer implemented simulator, as illustrated in FIG. 4, the direction is entered with a text editor under the "Directions" column.

In a similar manner, the layer priority for the chosen symbolic model symbol is selected. Within a particular system layer, symbolic model symbols are interconnected horizontally to symbolic model symbols that share the same priority. When symbolic model symbols have different priorities, they are interconnected to symbolic model symbols with the next lower priority and next higher priority creating an ordered vertical hierarchy. A particular system layer communicates with the layer above it and the layer below it in a hierarchical ordering of system layers. The ordering of system layers may be chosen by the user or a standard implementation, such as the OSI reference model described in ATM Networks Concepts, Protocols, Applications (Addison-Wesley Publishing Co. 1994), pp 58–59, may be selected.

The simulator automatically generates the necessary interconnections between multiple symbolic model symbols using a predetermined layer priority for each symbolic model symbol in conjunction with its selected direction. Source symbolic model symbols are associated with sink symbolic model symbols of the next higher and next lower layer priority. Highest layer priority symbolic model symbols in a particular system layer are connected with the lowest layer priority symbolic model symbols of the next higher priority layer according to the proper sink-source connection. In this manner, a chain of registers is determined from input to output in both sink and source directions. The layer priority and direction information also allows for error checking of prohibited interconnections of symbolic model symbols during later manipulation of the representation of a predetermined system layer using a typical editing cut/copy/paste feature.

The process step 224 shown in FIG. 2 for producing a functional specification for a particular symbolic model symbol will now be explained. For each symbolic model symbol, the user selects an associated memory register, for which the symbol is an artifact. This register contains the information indicating the state of the simulated hardware; that is, the associated component subset. The memory register is actually selected by choosing a memory register location or locations. For ease of reference, the user also selects a memory bit location name or names for each location. A memory bit name is assigned to the contents of each location of interest and a memory register type and a memory register size is then specified. To further specify the functionality, the reset or initial state of the register content is input to the register and the register mode is specified. Finally, for each register, an active high or active low sensing convention is specified.

Figure 5:
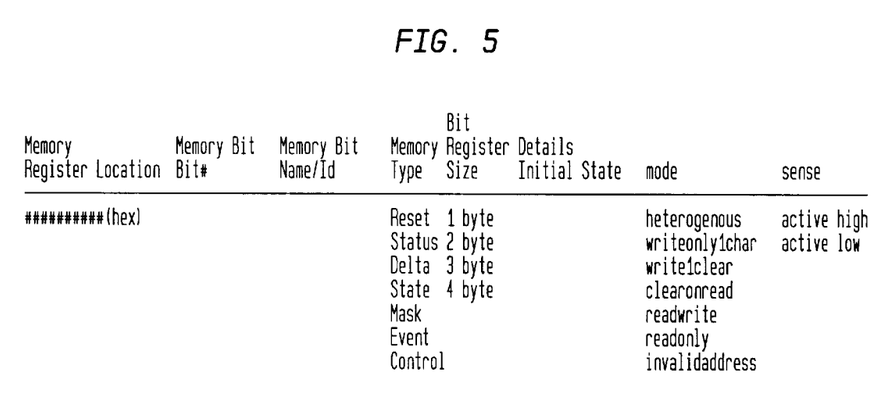
FIG. 5 is a representation of an exemplary display.

Referring to FIG. 5, an exemplary computer-human interface display is shown for inputting information necessary to specify the functionality of a particular symbolic model symbol, which is accomplished by accepting defaults for predefined symbolic model symbols or entering data to self-define the functionality of a symbolic model symbol. In the preferred embodiment, the hardware simulator prompts the user, via the interface, for the just-described specification information. For the next available memory register location, displayed in hexadecimal, the user is requested to input address name and memory name. For input of the memory register type, the simulator prompts the user to select reset, status, delta, state, mass, event or control. The memory size is chosen in increments of bytes (8 bits) or nibbles (4 bits). The interface will also prompt the user for register details: an initial state, an active bit sense condition and a register mode, which may be heterogeneous, read-only, write-only, write-only-one-shot, read-write, clear-on-read or invalid-address. The functional specification and association for each symbolic model symbol is stored in a database. Division and specification continue until all ICs and IC groups are specified.

A simulation proceeds from the specification and association for each symbolic model symbol. Each symbol (actually its memory register location) has an input/output (IO) memory allocated to the symbol. The simulator reads inputs from a symbol's source connection (actually its associated registers) and updates all of the symbol's register contents. The allocated output memory's updated register contents are broadcast to all symbolic model symbols which sink the symbol of interest. Those symbols' contents (actually their associated registers) are updated based on the broadcast updates of source symbols. One cycle of simulation is completed when a complete chain of registers is updated from input to output in both sink and source direction. As can be seen, the simulator of this invention is a state machine, which updates local memory register contents and associated outputs for each symbol in the symbolic model. A simulation may be commenced by simply modifying the state of any particular symbol (register) or selecting a start simulation button which has options for full cycle or step through each symbol as per signal propagation in the actual hardware under simulation.

Simulator Displays and Editing

Figure 6:
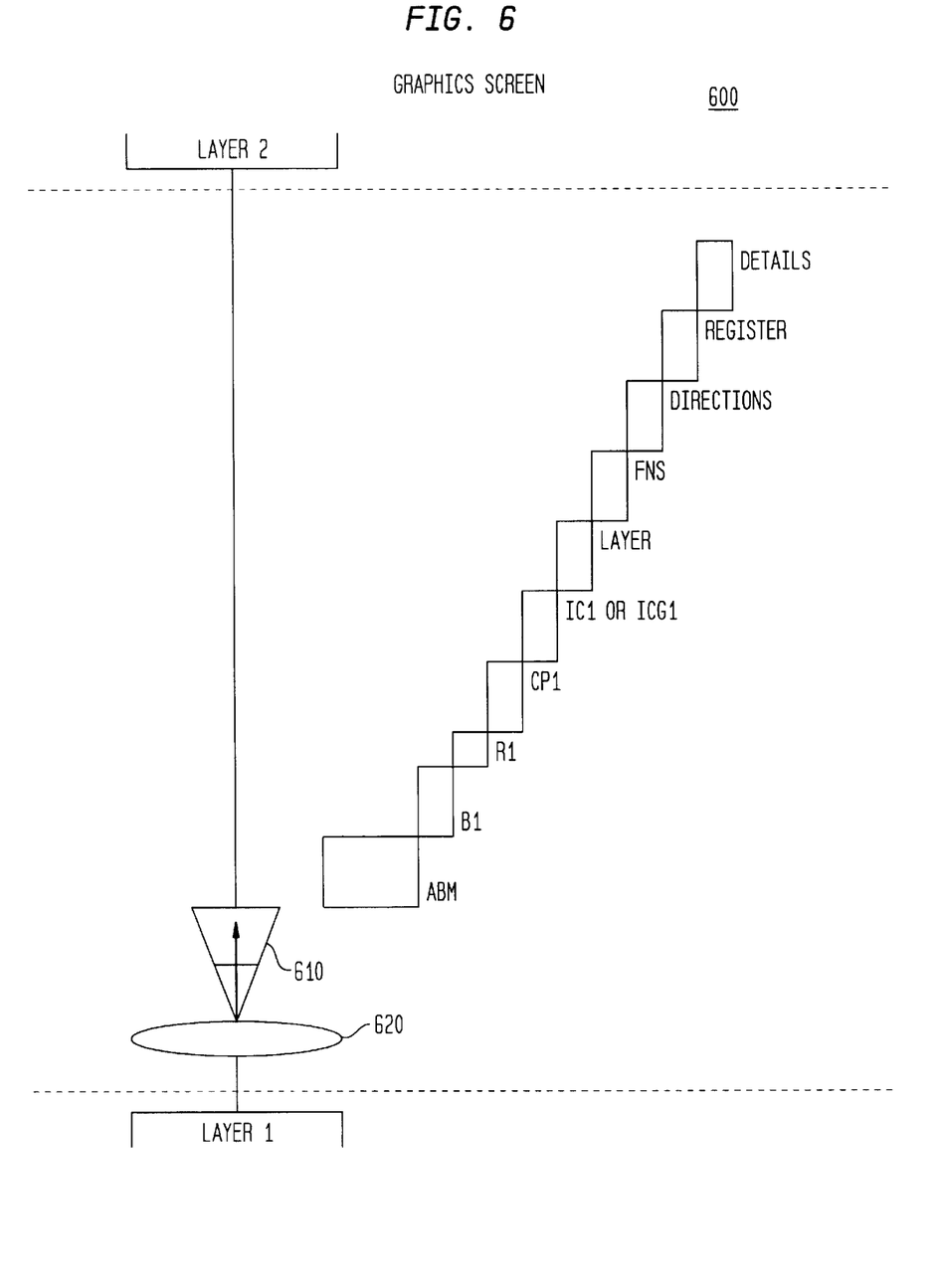
FIG. 6 is a representation of an exemplary display.

The hardware simulator of this invention also provides a graphics display as shown in FIG. 6. For any particular system, the graphics display will automatically draw the symbolic model from the symbolic model symbols previously input, according to each symbol's functional specification and system layer association. Each symbolic model symbol is associated with its specifying information in the data base, and the simulator has the capability to display the information for each symbolic model symbol. In FIG. 6, an exemplary graphics display 600 is shown. The symbolic model symbol 610 is displayed with all the specification information associated with it: a symbolic model symbol 610 is associated with system ABM, bay B1, rack R1, circuit pack CP1, IC1 or ICG1, system layer L1, its symbolic model symbol name (designated "Fns"), a direction and a memory register (actually its location). The layer priority of a first symbolic model symbol 610 in the system layer also is displayed graphically by the positioning of the first symbolic model symbol 610 in relation to a second symbolic model symbol 620. The details specifying the register functionality may also be displayed.

Figure 7:
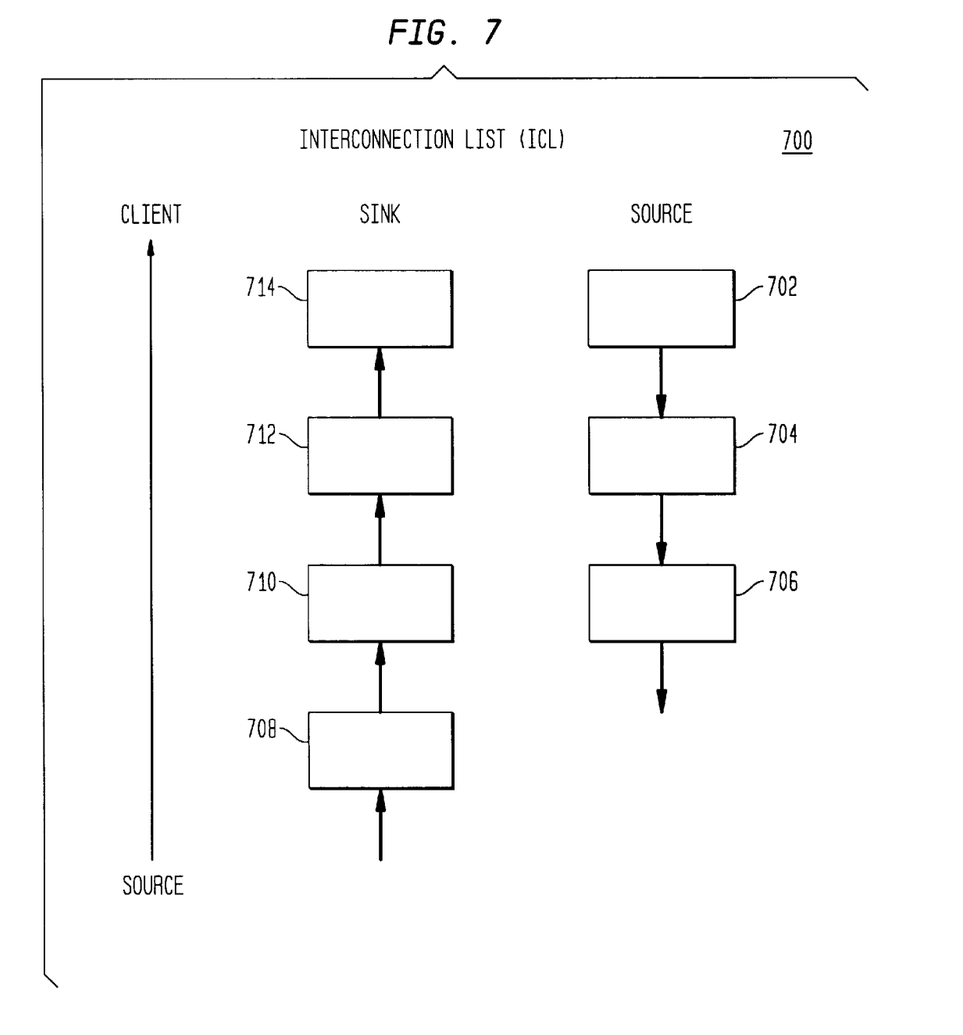
FIG. 7 is an exemplary interconnection list.

The hardware simulator of this invention also provides an interconnection list display, as shown in FIG. 7. The interconnection list 700 has two parts: a list of hardware components and their interconnections and a list of the symbolic model symbols and their interconnections. The user may choose to display one or both. In the illustrated list 700 of FIG. 7, only symbolic model symbol interconnections are shown. According to the list 700, symbol 702 sources a client symbol 704, which in turn sources a client symbol 706, and so forth to client symbol 714. The interconnection list is generated using the information input via the interface, or as previously stored in a database or look-up table. Alternatively, once the interconnection list has been generated, the information input via the interface or previously stored in the database is regenerated after a modification of the interconnection list. For example, symbolic model symbols can be cut and pasted at a different locations on the graphic display automatically updating the interconnection list, if such modification would be consistent with the interconnection of each symbolic model symbol's direction. These capabilities permit ease of debugging should a particular simulation behave in an unexpected manner. The interconnection list and graphics display also permit the use of an existing symbolic model to simulate some other system by breaking a connection and substituting another symbol or some other modification.

Figure 8:
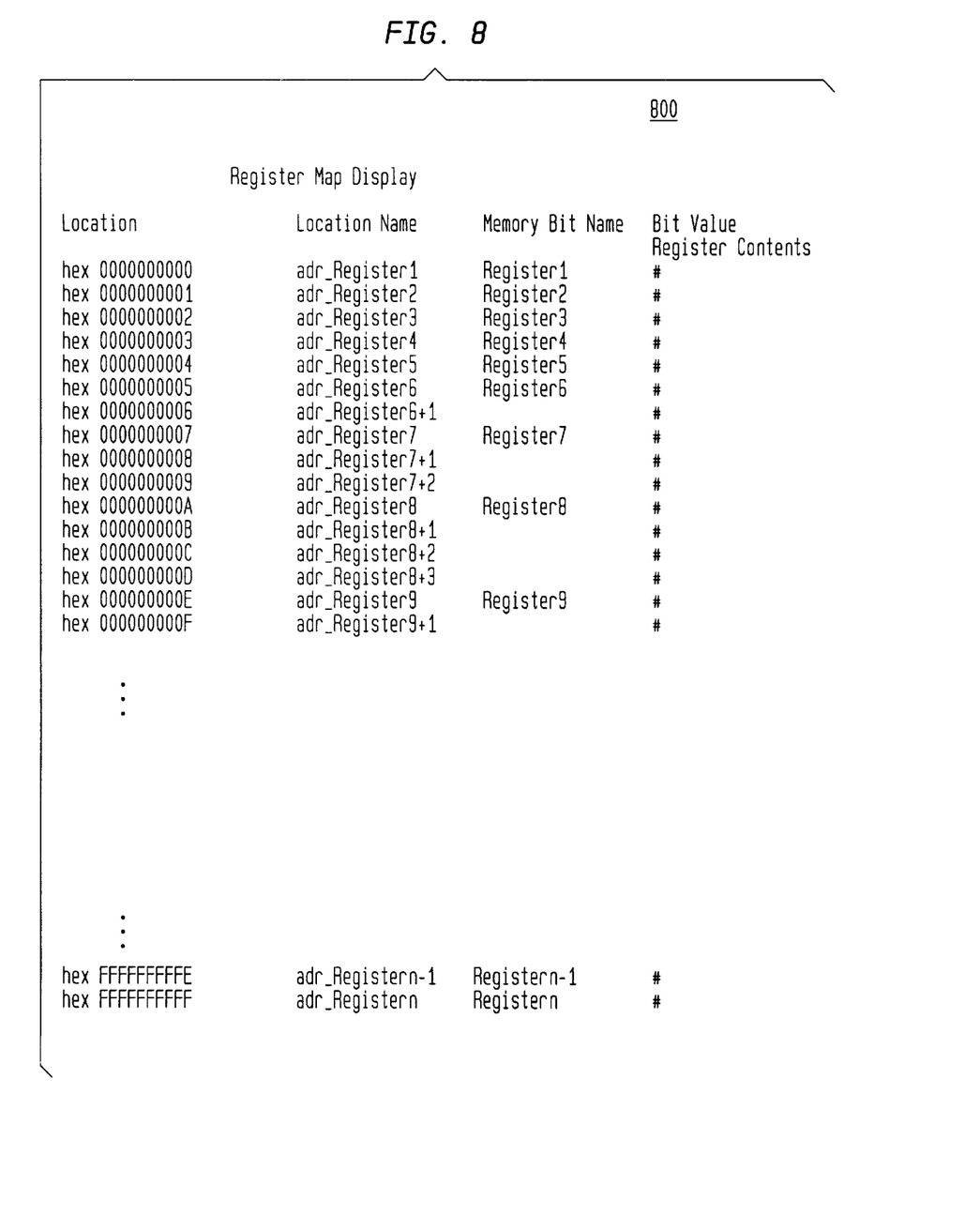
FIG. 8 is an illustration of a portion of the active register map.

The preferred embodiment also provides an active register map which shows the register map of every symbolic model symbol for a particular model. The register map information is generated from the functional specification and association for each symbol. The specification and association may be input with the provided interface or they may be stored in a data base or look-up table. An exemplary register map 800 is shown in FIG. 8. For each memory register location, specifying information is contained in the map 800, which will provide the state of a symbol after any particular simulation. In the displayed state, the map 800 shows the location of "n" registers, their location names, memory bit names and the bit value or register contents for each location.

It is an advantage of the invention that the hardware simulator may be operated to link its register map to a shared directory, for instance, a directory shared by other members of the development team. During the development process, a particular ASIC may fail some functionality test, requirements may change, or the researchers may modify a solution. Should some change occur impacting a symbolic model symbol, the change may be recorded in the shared directory and the symbol's register map file will be updated from the shared directory. Alternatively, the shared directory and the current register map file may be compared and the differences displayed on the display. The simulator operator may then choose to accept or reject the changes with respect to the model.

The Common Data Base

In the preferred embodiment, all information, including the symbols and their specifying data, are stored in a common data base. This advantageously permits reuse of a particular symbolic model symbol and its specifying information in numerous symbolic models. By selecting existing symbolic model symbols, a user can automatically generate a model without manually inputting specifying data. Also, all text and graphics screens are created from information stored in the common data base. Thus, should a user of the invention change the data in any one screen, all other screens, such as the interconnection list, graphical display, and text display, will reflect the change chosen by the user.

Real Time Simulation

Advantageously, the simulator may also be used as a real time event simulator. Where ICs or IC groups specified in the symbolic model have been developed using Very High Speed Integrated Circuits Hardware Description Language (VHDL), VERILOG™ or some similar tool, timing information in the IC simulation language files may be linked to the symbolic models. As is known, this timing information will permit each symbolic model symbol to become a real-time event simulator based upon the propagation delays specified in the timing information. Where interconnection between symbolic model symbols represent conductors with propagation delays, such as communication channels, the user may also input signal propagation properties such as delay information for each represented conductor. Together with IC simulation language timing information, for example VHDL or VERILOG™ timing information, each symbolic model becomes a real time simulator.

Conclusion

There has been described and illustrated herein, an apparatus for automatically generating symbolic models and for automatic development of an associated system level hardware simulator. The apparatus allows a system to be subdivided into a plurality of system layers which are associated with specified symbolic model symbols, each symbolic model symbol representing a functionality of a system layer. A symbolic model symbol gathers input from and broadcasts updates to associated symbolic model symbols, updating register contents as per its specification and completing a cycle of simulation when a complete chain of associated symbolic model symbols is updated. A displayed symbolic model can be interacted with to modify the model by altering the interconnections of the displayed symbolic model causing corresponding modification of the connections of other interconnected symbolic model symbols and their associated input/output memories. Linkage of a symbolic model to timing information specifying real-time propagation and time delays enables the simulator to operate as a real time event simulator.

It is to be understood that the invention is not limited to the illustrated and described forms of the invention contained herein. It will be apparent to those skilled in the art that various changes may be made without departing from the scope of the invention and the invention is not considered limited to what is shown in the drawings and described in the specification.

What is claimed is:

1. A system level hardware simulator, the system having a plurality of predetermined system layers, the simulator comprising:
   a symbolic model having a plurality of interconnected symbolic model symbols, each said symbolic model symbol having an association with at least one of said predetermined system layers;
   a predetermined functional specification for each said symbolic model symbol;
   an input/output memory associated with each said symbolic model symbol, said input/output memory operable to read inputs from a source symbolic model symbol and to provide updates from a memory register specified for said symbolic model symbol; and,
   a processor operable to execute according to predetermined instructions, said processor being responsive to said symbolic model and operable to update said register specified for each said symbolic model symbol in response to said inputs and to provide said updates from said register specified for said symbolic model symbol.

2. The hardware simulator of claim 1 wherein each said symbolic model symbol is selected from the group comprising:
   an adaptation symbol, a termination symbol, a connection symbol, and a switch fabric symbol.

3. The hardware simulator of claim 1 wherein said functional specification, comprises:
   a direction, a priority, a memory register location, a memory bit location name, a memory bit name, a memory register type, a memory size, a reset state, and an active bit sense.

4. The hardware simulator of claim 3 wherein said direction is selected from the group compromising a sink direction, a source direction, and a sink and source direction.

5. The hardware simulator of claim 1 wherein each of said predetermined system layers comprises:
   a predetermined bay of the system, a predetermined rack of said bay, a predetermined circuit pack of said rack, and at least one integrated circuit of said circuit pack.

6. The hardware simulator of claim 5 wherein said specification further comprises timing information for each said integrated circuit of said predetermined system layer.

7. The hardware simulator of claim 6 wherein said timing information is contained in integrated circuit simulation language files.

8. The hardware simulator of claim 6 wherein the simulator is a real-time event simulator.

9. The hardware simulator of claim 1 further comprising a data base operable to store said functional specification for each said symbolic model symbol and said association with said predetermined system layer for each said symbolic model symbol.

10. The hardware simulator of claim 1 further comprising an interconnect list for storing said interconnections of said symbolic model symbols.

11. The hardware simulator of claim 1 further comprising an editing apparatus implemented in a computer system including a display and an input device for editing said symbolic model, the editing apparatus, comprising:
    a graphical system implemented in the computer system which is responsive to inputs including inputs from the input device for controlling the display and which provides outputs indicating a state of the display; and
    an editor implemented in the computer system, the editor being responsive to a representation of said symbolic model and to the state outputs and operating in response to said representation to provide inputs to the graphical system which cause the graphical system to display the symbolic model represented by said representation and in response to state outputs indicating modification of the displayed symbolic model to correspondingly modify said representation.

12. The hardware simulator of claim 11 wherein said editor of said editing apparatus further comprises:
    a processor operable to execute according to predetermined instructions, said processor being responsive to the state outputs indicating modification of the displayed symbolic model, to perform checking for prohibited interconnection of symbolic model symbols based on said predetermined functional specification for each symbolic model symbol in said representation, to provide output appraising of prohibited modifications, and to update said representation of said symbolic model.

13. A system level hardware simulator, comprising:
    a graphical user interface, said interface including a display;
    a processor operable to execute according to predetermined instructions, said processor being responsive to said graphical user interface;
    a memory for storing said predetermined instructions, wherein said predetermined instructions are operable to cause said processor to construct a plurality of interconnected symbolic model symbol images on said display, each said symbolic model symbol having an association with a predetermined system layer and each symbolic model symbol having a predetermined functional specification; and, a plurality of input/output memories responsive to said processor, each said input/output memory allocated to one of said symbolic model symbols, said input/output memories operable to store inputs from a source symbolic model symbol, said input/output memories operable to cause said processor to update a register specified for each said symbolic model symbol in response to said inputs and to provide said updates from said register specified for said symbolic model symbol.

14. The hardware simulator of claim 13 wherein each said symbolic model symbol is selected from the group comprising:
   an adaptation symbol, a termination symbol, a connection symbol, and a switch fabric symbol.

15. The hardware simulator of claim 13 wherein said functional specification, comprises:
   a direction, a priority, a memory register location, a memory bit location name, a memory bit name, a memory register type, a memory size, a reset state, and an active bit sense.

16. The hardware simulator of claim 15 wherein said direction is selected from the group consisting of a sink direction, a source direction, and a sink and source direction.

17. The hardware simulator of claim 15 wherein said specification further comprises timing information for each said integrated circuit of said predetermined system layer.

18. The hardware simulator of claim 17 wherein said timing information is contained in integrated circuit simulation language files.

19. The hardware simulator of claim 17 wherein the simulator is a real-time event simulator.

20. The hardware simulator of claim 13 wherein each of said predetermined system layers comprise:
   a predetermined bay of the system, a predetermined rack of said bay, a predetermined circuit pack of said rack, and at least one integrated circuit of said circuit pack.

21. The hardware simulator of claim 13 further comprising a storage device operable to store said functional specification for each said symbolic model symbol and said association for each said symbolic model symbol.

22. A method for system level hardware simulation using a symbolic model, the model comprising a plurality of interconnected symbolic model symbols in said symbolic model, each of the symbolic model symbol associating with at least one memory register, the method comprising the steps of:
   associating each said symbolic model symbol with a predetermined system layer;
   specifying a predetermined functionality for each said symbolic model symbol;
   interconnecting said plurality of symbolic model symbols according to said predetermined functionality and to said predetermined system layer association; and,
   updating each said memory register according to a state change in at least one said memory register.

23. The method of claim 22 wherein said predetermined functionality for each said symbolic model symbol is selected from the group consisting of direction information, priority information, memory register location information, and state of said memory register information.

24. The method of claim 22 wherein each said symbolic model symbol is selected from the group comprising:
   an adaptation symbol, a termination symbol, a connection symbol, and a switch fabric symbol.

25. The method of claim 22 wherein said specifying step includes specifying
   a memory bit location name, a memory bit name, a memory register type, a memory size, a reset state, and an active bit condition.

26. The method of claim 25 wherein said direction is selected from the group comprising a sink direction, a source direction, and a sink and source direction.

27. The method of claim 22 wherein said step of associating each said symbolic model symbol with a predetermined system layer comprises the steps of:
   selecting a predetermined bay of the system, a predetermined rack of said bay, a predetermined circuit pack of said rack, and at least one integrated circuit of said circuit pack.

28. The method of claim 27 further including specifying timing information for each said integrated circuit of said predetermined system layer.

29. The method of claim 28 wherein said timing information is contained in integrated circuit simulation language files.

30. The method of claim 28 wherein the simulation is a real-time event simulation.

31. The method of claim 22 wherein said step of interconnecting said plurality of symbolic model symbols according to said predetermined functionality and to said predetermined system layer association comprises the steps of:
   associating each said symbolic model symbol of a said predetermined priority and said predetermined direction with all said symbolic model symbols of the same priority and same direction within a one of said system layers;
   associating each said symbolic model symbol of a said predetermined priority and said predetermined direction with all said symbolic model symbols of the next lower priority and opposite direction and with all said symbolic model symbols of the next higher priority and opposite direction.

32. The method of claim 22 further comprising the step of storing in a data base each said functional specification for each said symbolic model symbol and said association for each said symbolic model symbol.

33. The method of claim 32 further including the step of:
   displaying a representation of the symbolic model according to said predetermined interconnection of said symbolic model symbols, said predetermined functionality and said predetermined system layer association.

34. The method of claim 33 further including the steps of:
   modifying a predetermined display of said representation of the symbolic model;
   checking said modifications for prohibited interconnections of symbolic model symbols; and
   outputting error messages for modifications which would result in prohibited interconnections.

35. The method of claim 34 further including the steps of:
   updating said data base storing said association for each said symbolic model symbol in said representation of the symbolic model to reflect said modifications.

36. The method of claim 22 wherein said updating step includes the steps of:
   associating an input/output memory with each said symbolic model symbol;
   reading said input/output memory from a source symbolic model symbol; and,
   outputting from said input/output memory updates from said memory register specified for each said symbolic model symbol.

* * * * *